United States Patent [19]

Kuwayama

[11] Patent Number: 4,504,855

[45] Date of Patent: Mar. 12, 1985

[54] COLOR IMAGING DEVICE

[75] Inventor: Tetsuro Kuwayama, Yokohama, Japan

[73] Assignee: Canon Kabushiki Kaisha, Tokyo, Japan

[21] Appl. No.: 390,021

[22] Filed: Jun. 18, 1982

[30] Foreign Application Priority Data

Sep. 17, 1981 [JP] Japan ................................ 56-146584

[51] Int. Cl.$^3$ .............................................. H04N 9/07
[52] U.S. Cl. ..................................................... 358/44
[58] Field of Search ................................... 358/43, 44

[56] References Cited

FOREIGN PATENT DOCUMENTS 55-22852  2/1980  Japan .

Primary Examiner—Richard Murray
Attorney, Agent, or Firm—Fitzpatrick, Cella, Harper & Scinto

[57] ABSTRACT

Disclosed is a color imaging device which comprises a plurality of first portions for generating first color information signals, a plurality of second portions for generating second color information signals, and a plurality of third portions for generating third color information signals, wherein the size of each of the second portions is greater than the size of each of the first and third portions.

36 Claims, 11 Drawing Figures

COLOR IMAGING DEVICE

BACKGROUND OF THE INVENTION

1. Field of the Invention

This invention relates to a color imaging device, and, more particularly, to a color imaging device having a combination of a solid image pickup element with a color filter.

2. Description of the Prior Art

When, in a solid image pickup element of charge transfer type such as a CCD or the like, an intense light impinges on a part of the element, electric charges generated thereby may flow thereover into adjacent elements to break down the picture image over a wide area on the picture plane, as is known as "blooming".

In order to prevent such blooming, it has been proposed to provide, in a case of a frame transfer type CCD, an anti-blooming gate and an anti-blooming drain to absorb overflown charges.

FIG. 1 shows an image pickup part of a conventional CCD having anti-blooming drains at the boundaries of the picture elements in the horizontal direction and also shows the state of the potential well thereof.

Between the picture elements 1a-1d, anti-blooming gates 2a-2c and anti-blooming drains 3a-3c are formed. In the part (b) in FIG. 1, the shaded portions represent the stored charges. When an intense light impinges on the solid image pickup element and a large number of electric charges are generated thereby, the charges will flow over the anti-blooming gates 2a-2c into the anti-blooming drains 3a-3c. Thus, blur of the picture image due to the blooming is suppressed to minimum.

In the prior art arrangement shown in FIG. 1, however, the area occupied by the anti-blooming parts (gates 2 and drains 3) will increase with the increase of the number of the picture elements in the horizontal direction. Thus, the number of the picture elements is disadvantageously restricted provided that the dimension of the picture plane is fixed. Further, the light incident on the anti-blooming gates and anti-blooming drains does not contribute to effective outputs, and therefore, the utilization efficiency of the light and the sensitivity are degraded.

Improved prior art arrangements which are free from the above disadvantages are shown in FIGS. 2 and 3.

In the FIG. 2 arrangement, which is one such as disclosed in Japanese Patent Application Laid-Open No. 24530/1979, usual channel stoppers 4 and anti-blooming parts 2 and 3 are alternatingly provided at the boundaries between the picture elements. Although the disadvantages involved in the FIG. 1 arrangement are solved herein, other problems are offered. First, since the sampling positions of the picture elements are not equidistant, there may occur moire in the produced luminance signals (i.e. the phenomenon of turn-back of high range components of the picture image to low range). Second, when use is made of an R(red)-G(green)-B(blue) or an R(red)-G(green)-Cy(cyan) stripe type filter which is effective, in combination of the frame transfer type CCD, to perform superior detection of a color picture image, the periodical structure in the horizontal direction is provided by six picture elements. Thus there occurs image distortion of the very low frequency component. Such six-picture-element periodical structure is of so low frequency that there may occur moire even in the case of an object which does not have fine patterns. As the result, image quality of the obtained picture image is degraded.

The CCD shown in FIG. 3 is one such as disclosed in Japanese Patent Application Laid-Open No. 56789/1980. Designated at 2 are anti-blooming gates, denoted at 3 are anti-blooming drains and denoted at 4' are barriers. Between the two anti-blooming parts (gates 2 and drains 3), there are formed first, second and third portions 1R, 1B and 1G divided by the barriers 4'. Such structure is periodically repeated in the horizontal direction. The size (width W) of each of the first, second and third portions 1R, 1B and 1G is the same and an R(red) filter, B(blue) filter and G(green) filter are respectively provided for the first, second and third portions.

In this arrangement, good color picture images are obtainable with the use of the R-G-B stripe filter. However, this arrangement is still disadvantageous in the following points. That is, a complicated signal processing circuit is required to obtain the high range component of the luminance (Y) signal by synthesizing the output from the solid image pickup element. As disclosed in the above-cited Japanese Patent Application, in order to synthesize the high range component of the luminance signal, there are required:

(1) means for separating the output corresponding to each color filter and for sampling the separated the output;

(2) means for amplifying the separated output to a required signal level; and (3) means for imparting to respective color signals the necessitated phase deviation and for sampling them again.

As the result, the signal processing circuit becomes complex. Further, in this arrangement, the sampling positions are not equidistant, and therefore the resolution is degraded since the resolution is determined by the greatest distance between the sampling positions. On the other hand, when the solid image pickup element shown in FIG. 1 is used in combination with the R-G-B stripe filter and if the device is so set that, with respect to a white (non-colored) object, the output signals from picture element are read out equally and at equal intervals, the high range component of the luminance signal is obtainable only by supplying the signal from the image pickup element to a high pass filter as is discussed in "TV Academic Circle Journal" vol. 33 No. 7 pages 516–522. In such a system, the signal processing circuit becomes simple, but the overall sensitivity of the camera is restricted due to the B(blue) output signal to which the sensitivity of the solid image pickup element is relatively low. Thus, it becomes difficult to ensure high sensitivity of the camera. Although, by changing the combination of the colors of the filter, e.g. to R(red)-Cy(cyan)-G(green), the sensitivity may be improved to some degree, such color signals which enter from the high range component of the luminance distribution into B(blue) signals will be increased in this case. Therefore, the sensitivity to blue of the element is desired as high as possible.

SUMMARY OF THE INVENTION

In view of the foregoing, it is a primary object of the present invention to provide an improved color imaging device which is capable of producing color picture images of high sensitivity and high quality with a simplified structure, making the best use of only advantages of the prior art arrangements.

Another object of the present invention is to provide a color imaging device which is less restricted by the light separating sensitivity characteristics of the image pickup element and therefore which enables improvement of the overall sensitivity.

In order to achieve these objects, according to one preferred embodiment of the invention, among a plurality of portions corresponding to different colors, one which corresponds to a wavelength region (color) of low light separation sensitivity of the image pickup element has a size greater than those of the others.

Another object of the present invention is to provide a color imaging device wherein anti-blooming parts are provided at a unit-color-periodicity, and wherein, in spite of such provision of the anti-blooming parts, decrease of resolution can be prevented.

According to another aspect of the invention, the portion which does not neighbor the anti-blooming part has a size greater than those of the other portions.

It will be easily understood that the combination of the feature just mentioned above with the feature as first-mentioned is most preferable, although they have their respective significant advantages.

According to a further aspect of the invention, there is provided a color imaging device wherein, between two anti-blooming parts, three picture element portions are defined by two barriers and wherein one of the barriers is made higher than the other and than the barriers in the anti-blooming parts. Such arrangement is quite useful in that, even when blooming occurs at one portion (one picture element), the color reproduction in at least one vector direction can be retained.

Other objects and features of the invention will be apparent from the following description taken in conjunction with the accompanying drawings.

DESCRIPTION OF THE PREFERRED EMBODIMENTS

Figure 4A:
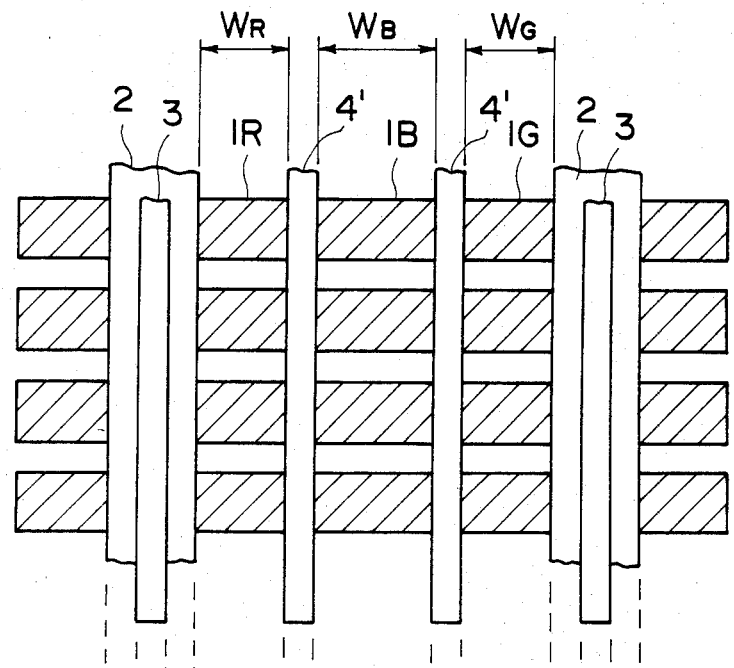
FIG. 4 schematically shows a first embodiment of the present invention and the potential well thereof.
Figure 4B:
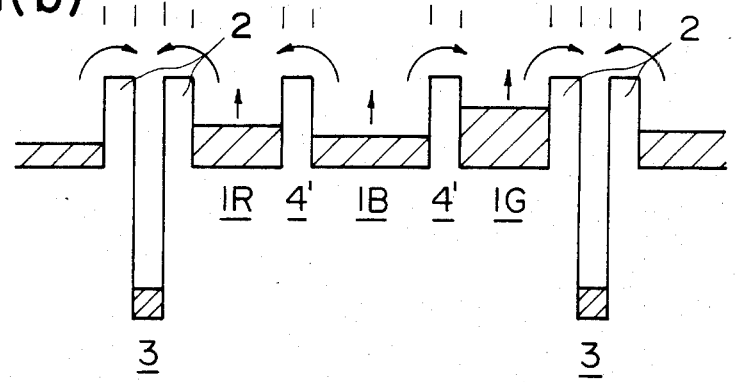

Referring to FIG. 4 which shows a first embodiment of the present invention, picture elements 1R, 1B and 1G, which generate electric charges correspondingly to the amount of incident radiation and store the generated charges, correspond to stripe filters (not shown) for the colors of R, B and G, respectively. The significantly distinguishing points of the present invention over the prior art are that the distances between the margins of the picture elements are substantially the same and that the widths $W_R$, $W_B$ and $W_G$ of the picture elements in the horizontal direction are different from each other. As is shown in part (a) in FIG. 4, when the width of the picture element corresponding to a filter for a short wavelength such as the blue (B) filter, for example, is made greater than those of the others, the amount of charges to be stored therein will be increased. Accordingly, in spite of the fact that the inherent sensitivity to blue light of the solid image pickup element is low, the level of the signal after having been voltage-converted as an output signal will be increased relative to those of the other signals, as if the sensitivity to blue of the solid image pickup element is improved.

Figures 1A, 1B:
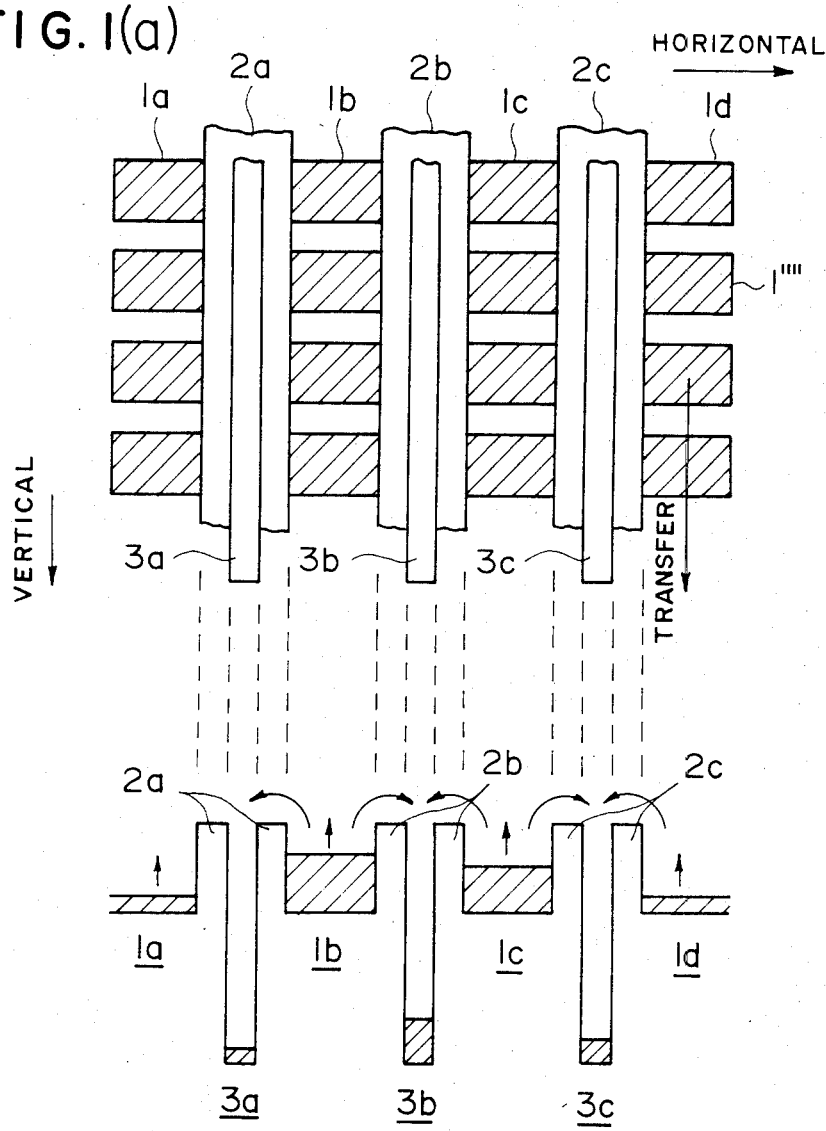
FIG. 1 schematically shows a conventional image pickup device and the potential well thereof.
Figure 2A:
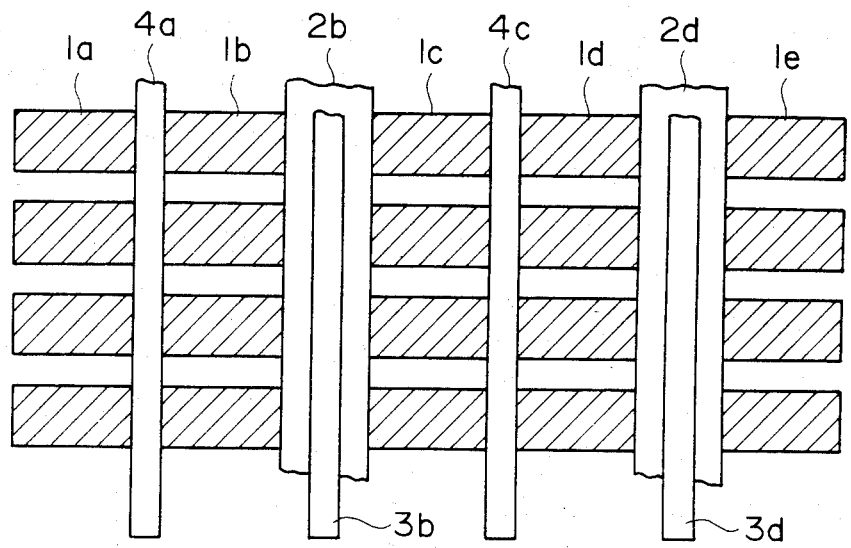
FIG. 2 schematically shows another example of a conventional image pickup device and the potential well thereof.
Figure 2B:
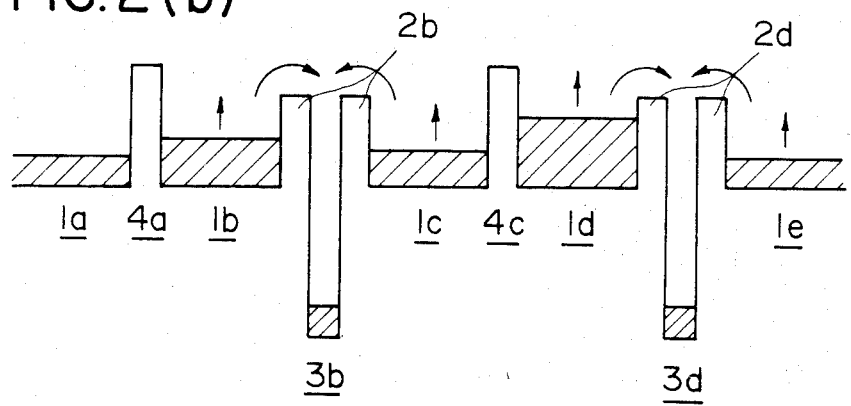

With the present invention, the B output signal which is the ultimate cause that prevents improvement in the sensitivity of the solid image pickup element in FIG. 1 is increased about one and a half times and the effective sensitivity is accordingly increased about one and a half times.

Part (b) in FIG. 4 shows the potential level on the surface of the CCD. The levels of the barriers 4' should be equal to, but one may be higher than, the level of the anti-blooming gate 2. When the level of the anti-blooming gate 2 is varied in synchronism with the drive of the CCD in accordance with the dynamic blooming-prevention process, at least one of the barriers 4' is desirably controlled so that the level thereof become equal to that of the anti-blooming gate 2. Assuming now that a very intense blue light impinges on the pickup element and that the electric charges flow over the picture element 1B, these charges will flow into one or both of the picture elements 1R and 1G. In such case, however, significant blur of the picture image can be prevented by, for example, using a blooming detecting circuit (not shown) to make the output picture image to white.

Figure 3A:
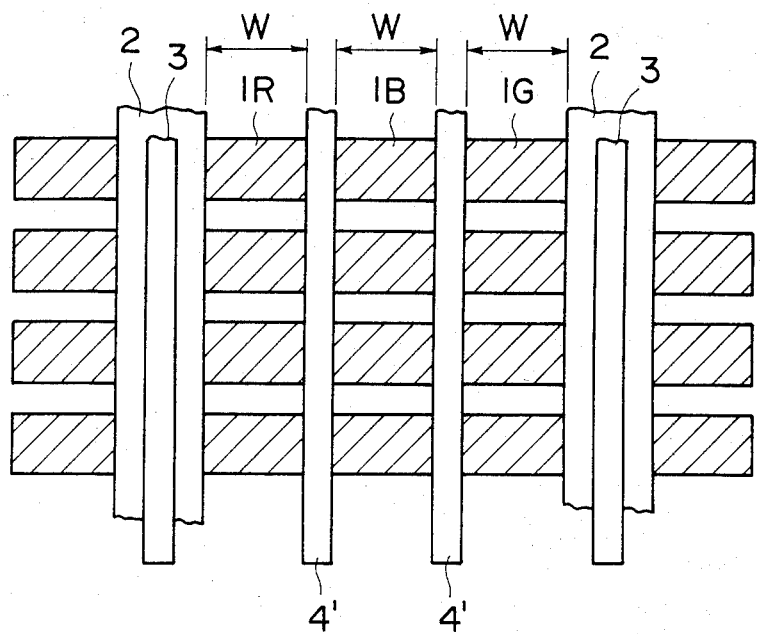
FIG. 3 schematically shows a further example of a conventional image pickup device and the potential well thereof.
Figure 3B:
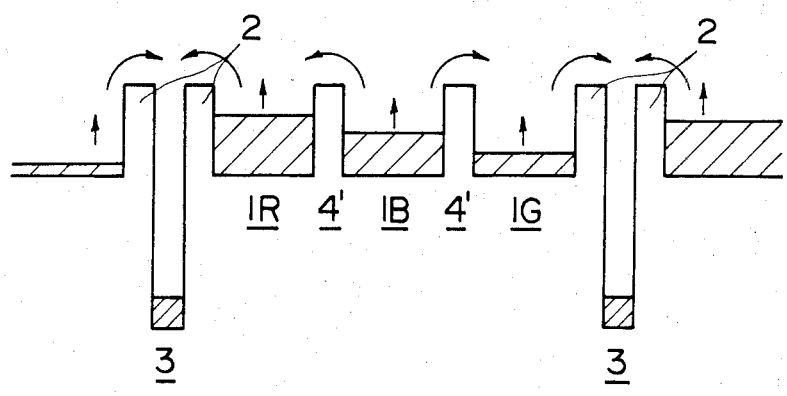

The second effect of the present invention is that the sampling positions of the picture elements become near equidistant. In the present invention, as compared with the solid image pickup element shown in FIG. 3, the width of the center picture element is increased, so that the sampling positions of the left-hand side and right-hand side picture elements 1R and 1G approach the anti-blooming drain 3. Thus, the sampling positions can be made near equidistant, which could not be ensured in the FIG. 3 arrangement.

The third effect of the present invention is that the present invention can be embodied only by adding minor changes to the IC manufacturing process. For example, upon element designing, the barriers 4' and anti-blooming drains 3 are so set that they have the same width and same pitch while the anti-blooming gates 2 are added at a predetermined width. Whereby the invention can be simply embodied without additionally setting a pattern of special pitch.

Figure 5:
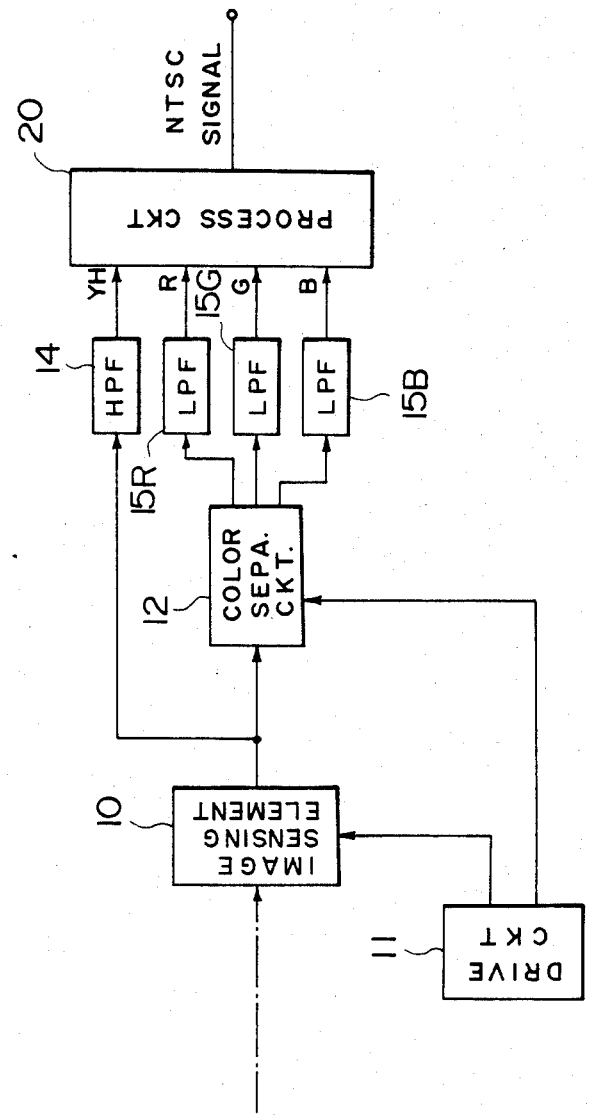
FIG. 5 is a diagram showing a circuit for processing an output from the element in FIG. 4.

FIG. 5 shows a signal processing circuit for obtaining a color TV signal from the color imaging device according to the present invention. The solid image pickup element 10 combined with color filters is driven by a drive circuit 11, and the output therefrom is applied as an input to a high-pass filter 14 and to a color separation circuit 12. The signal passed through the high-pass filter 14 is rendered into one only having high frequency components and is applied to a process circuit 20 to be used as a high range signal $Y_H$ of the luminance signal, the process circuit 20 producing a composite video signal for a color TV. On the other hand, in response to a sampling pulse from the drive circuit 11, the color separation circuit 12 performs separation of color signals. Color signals so separated pass through low range filters 15R, 15G and 15B and thereafter are applied to the process circuit as inputs for R, G and B.

The color signals of R, G and B and the high range signal $Y_H$ of the luminance signal thus obtained are amplified in the process circuit 20 to proper degrees, and, after passing through a matrix circuit, a gamma circuit and the like, are put out as a composite video signal such as an NTSC signal.

Figure 6A:
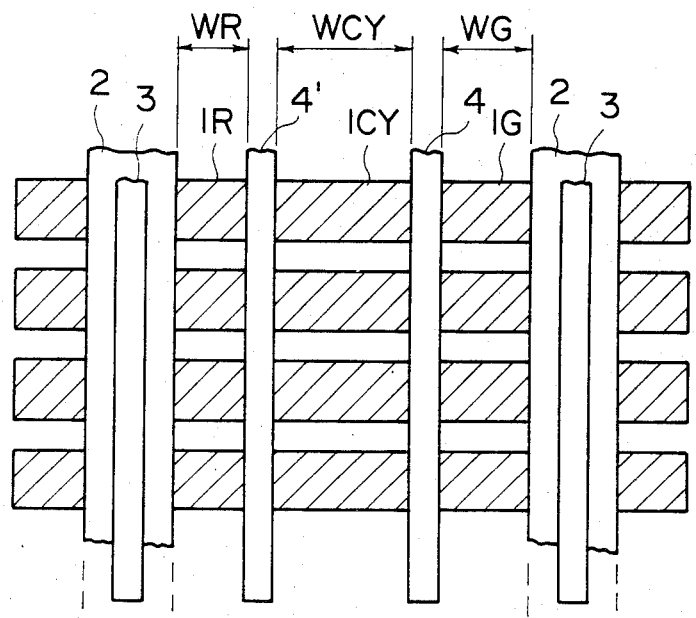
FIG. 6 schematically shows a second embodiment of the present invention and the potential well thereof.
Figure 6B:
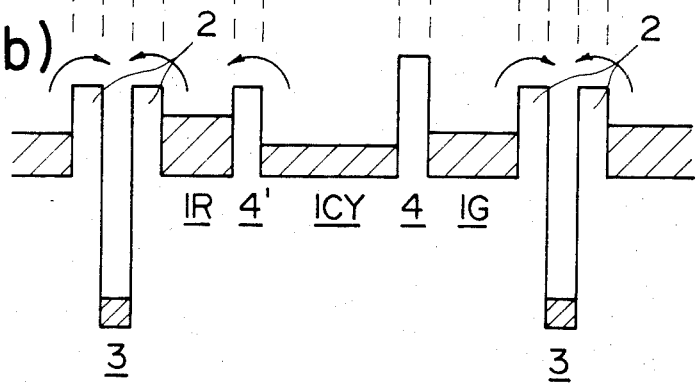

A second embodiment of the present invention is shown in FIG. 6. In this embodiment, the widths $W_R$, $W_{Cy}$ and $W_G$ of the picture elements differ from one another. Further, the potential levels of the barriers 4 and 4' differ from each other. The higher barrier 4 may be a channel stopper while the lower barrier 4' may have a potential level substantially equal to that of the anti-blooming gate 2. By having the freedom as to the widths of the picture elements such as above, the improvement of the sensitivity, improvement of the resolution and the occurrence of a false color signal can be skillfully balanced and the color picture image detecting device can be constructed easily. Since the levels of the channel stopper 4 and the barrier 4' are different from each other, these occurs no mixation of the charges at the picture element 1Cy (cyan=blue+green) and the picture element 1G. Further, even if the blooming partly occurs, color reproduction in a certain vector direction can be maintained.

When the color imaging device comprising the solid image pickup element shown in FIG. 6 is combined with the signal processing circuit shown in FIG. 5, the color signals to be obtained are R, Cy and G. In this case, by subtracting at an appropriate rate from the Cy signal, a blue (B) signal is obtainable.

According to the present invention, as described in the foregoing, reduction in size of the elements and increase of the number of the elements are simply assured. In addition, there is provided means which enables TV signals of high quality to be obtained easily.

I claim:

1. A charge-coupled imager comprising:
   (A) a two-dimensional image sensing array having a plurality of columns and a plurality of rows, said sensing array generating electrical charges;
   (B) anti-blooming portions having therebetween three of said columns of said sensing array, each of said anti-blooming portions having a predetermined width;
   wherein the width of one second column at the center of said three columns between two adjacent anti-blooming portions is greater than those of the other, first and third columns;
   a first barrier disposed between said first column and said second column; and
   a second barrier disposed between said second column and said third column.

2. The imager according to claim 1, wherein the electrical potential of said second barrier is higher than that of said first barrier.

3. The imager according to claim 2, wherein each of said second barriers includes a channel stopper.

4. The imager according to claim 1 or 2 or 3, further comprising:
   a striped color filter having a plurality of first striped portions with first color, a plurality of second striped portions with second color, and a plurality of third striped portions with third color, each of said first striped portions being aligned with each of said first columns, each of said second striped portions being aligned with each of said second columns, and each of said third striped portions being aligned with each of said third columns.

5. The imager according to claim 4, wherein said first, second and third colors include red, blue and green, respectively.

6. The imager according to claim 4, wherein said first, second and third colors include red, blue plus green and green, respectively.

7. The imager according to claim 4, wherein the pitches between the neighboring columns are almost equal to each other.

8. The imager according to claim 1, 2 or 3, wherein the pitches between the neighboring columns are almost equal to each other.

9. A charge-coupled imager comprising:
   (A) a two-dimensional image sensing array having a plurality of columns and a plurality of rows, said sensing array generating electrical charges;
   (B) anti-blooming portions having therebetween three of said columns of said sensing array;
   (C) first barriers of a predetermined electrical potential and having therebetween three of said columns of said sensing array, said first barriers being disposed at positions different from those of said anti-blooming portions; and
   (D) second barriers of predetermined electrical potential and having therebetween three of said columns of said sensing array, said second barriers being disposed at positions different from those of said anti-blooming portions and said first barriers;
   wherein the electrical potential level of said second barriers is higher than that of said first barriers.

10. The imager according to claim 9, wherein said anti-blooming portions have a predetermined electrical potential, the level of which is almost equal to that of said first barriers.

11. The imager according to claim 10, wherein each of said second barriers includes a channel stopper.

12. The imager according to claim 9 or 10 or 11, further comprising:
    a striped color filter having a plurality of first striped portions with first color, a plurality of second striped portions with second color, and a plurality of third striped portions with third color, each of said first striped portions being aligned with each of first columns, each of said second striped portions being aligned with each of second columns, and each of said third striped portions being aligned with each of third columns;
    each of said first columns being positioned between one of said anti-blooming portions and one of said first barriers,
    each of said second columns being positioned between one of said first barriers and one of said second barriers, and
    each of said third columns being positioned between one of said second barriers and one of said anti-blooming portions.

13. The imager according to claim 12, wherein said first, second and third colors include red, blue and green, respectively.

14. The imager according to claim 12, wherein said first, second and third colors include red, blue plus green and green, respectively.

15. A color imager having a plurality of radiation sensitive portions separated from each other by insensitive portions, said sensitive portions including a plurality of first sensitive portions for generating first color information signals, a plurality of second sensitive portions for generating second color information signals, and a plurality of third sensitive portions for generating third color information signals;

wherein each of the second sensitive portions is positioned between one of the first sensitive portions and one of the third sensitive portions, and the size of each of the second sensitive portions is larger than that of each of the first and third sensitive portions, and the size of each of the insensitive portions for separating the neighboring first and third sensitive portions from each other is larger than that of each of the remaining insensitive portions so that the pitch between neighboring sensitive portions is substantially constant.

16. The imager according to claim 15, wherein said radiation sensitive portions are arranged in a two-dimensional array.

17. The imager according to claim 15, wherein said second color corresponds to a shorter wavelength region of the light.

18. The imager according to claim 17, wherein said second color includes blue.

19. The imager according to claim 17, wherein said second color includes cyan.

20. The imager according to claim 17, 18 or 19, wherein said first color includes red.

21. The imager according to claim 20, wherein said third color includes green.

22. The imager according to claim 21, wherein the size of each of the third sensitive portions is almost equal to that of each of the first sensitive portions.

23. The imager according to claim 17, 18 or 19, wherein said third color includes green.

24. The imager according to claim 15 or 16, wherein the size of each of the third sensitive portions is almost equal to that of each of the first sensitive portions.

25. A color image pick-up device comprising:
(A) radiation sensing means having pluralities of first, second, and third sensing portions for generating electrical signals corresponding to a pattern of radiation, said sensing portions being separated from each other by separating portions; and
(B) color filter means having pluralities of first, second and third filter portions, said first, second and third filter portions having different colors from each other, the first filter portions being arranged to correspond to said first sensing portions, the second filter portions being arranged to correspond to said second sensing portions, and the third filter portions being arranged to said third sensing portions;
wherein each of the second sensing portions is positioned between one of the first sensing portions and one of the third sensing portions, and the size of each of the second sensing portions is larger than that of each of the first and the third sensing portions, and the size of each of the separating portions for separating the neighboring first and third sensing portions from each other is larger than that of each of the remaining separating portions so that the pitch between neighboring sensing portions is substantially constant.

26. The device according to claim 25, wherein the size of each of the first sensing portions is almost equal to the size of each of the third sensing portions.

27. The device according to claim 25 or 26, wherein said second filter portions have a color corresponding to a wavelength region of light of lower sensitivity of said radiation sensing means.

28. The device according to claim 27, wherein said second filter portions have a color of blue.

29. The device according to claim 27, wherein said second filter portions have a color of cyan.

30. The device according to claim 29, wherein said first filter portions have a color of red, and said third filter portions have a color of green.

31. The device according to claim 28, wherein said first filter portions have a color of red, and said third filter portions have a color of green.

32. The device according to claim 25 or 26, wherein said sensing portions are arranged in columns and rows to form a two-dimensional array, said first sensing portions being arranged in selected first columns, said second sensing portions being arranged in selected second columns, and said third sensing portions being arranged in selected third columns.

33. The device according to claim 32, wherein said filter means has a plurality of striped filter portions corresponding to said columns of said two-dimensional array of said sensing portions.

34. A charge-coupled imager comprising:
(A) a two-dimensional image sensing array having a plurality of columns and a plurality of rows, said sensing array generating electrical charges;
(B) anti-blooming portions having therebetween three of said columns of said sensing array, each of said anti-blooming portions having a predetermined width;
wherein the width of one second column at the center of said three columns between two adjacent anti-blooming portions is greater than those of the other, first and third columns; and
(C) a striped color filter having a plurality of first striped portions with first color, a plurality of second striped portions with second color, and a plurality of third striped portions with third color, each of said first striped portions being aligned with a respective said first column, each of said second striped portions being aligned with a respective said second column, and each of said third striped portions being aligned with a respective said third column.

35. The imager according to claim 34, wherein said first, second and third colors include red, blue and green, respectively.

36. The imager according to claim 34, wherein said first, second and third colors include red, blue plus green, and green, respectively.

* * * * *